United States Patent [19]
Kim et al.

[11] Patent Number: 5,883,848
[45] Date of Patent: Mar. 16, 1999

[54] SEMICONDUCTOR DEVICE HAVING MULTIPLE SIZED MEMORY ARRAYS

[75] Inventors: Tae-Hyoung Kim, Kyunggi-do; Young-Hyun Jun, Seoul, both of Rep. of Korea

[73] Assignee: LG Semicon Co., Ltd., Cheongju, Rep. of Korea

[21] Appl. No.: 943,251

[22] Filed: Oct. 17, 1997

[30] Foreign Application Priority Data

May 29, 1997 [KR] Rep. of Korea .................. 21681/1997

[51] Int. Cl.$^6$ ...................................................... G11C 7/00
[52] U.S. Cl. ................ 365/230.03; 365/239; 365/230.04
[58] Field of Search ............................. 365/230.03, 239, 365/230.04, 221

[56] References Cited

U.S. PATENT DOCUMENTS 5,691,955  11/1997  Yamauchi ........................... 365/230.03
5,748,555   5/1998  Park ................................... 365/230.03

Primary Examiner—Vu A. Le
Attorney, Agent, or Firm—Fleshner & Kim

[57] ABSTRACT

A semiconductor memory device is provided that enhances data output speed. The semiconductor uses dual memory arrays with differing activation voltage levels. The semiconductor memory includes a first memory cell array having multiple memory cells and a second memory cell array having more memory cells than the first memory cell array. First and second row decoders respectively receive first and second row addresses to respectively generate an activation signal for a word line in the first memory cell array and subsequent word lines in the second memory cell array. A column decoder receives and decodes a column address to generate a bit line selection signal for the first and second memory cell arrays. The semiconductor device further includes a sense amplifier, which is coupled to bit lines selected based on the bit line selection signals, that detects a potential difference between the bit lines caused by data and amplifies the potential difference. The sense amplifier also refreshes the data on the memory cell from which the data was read.

20 Claims, 4 Drawing Sheets

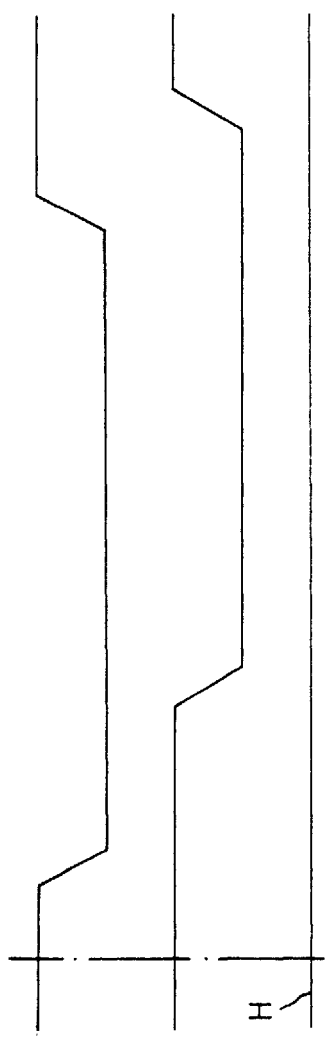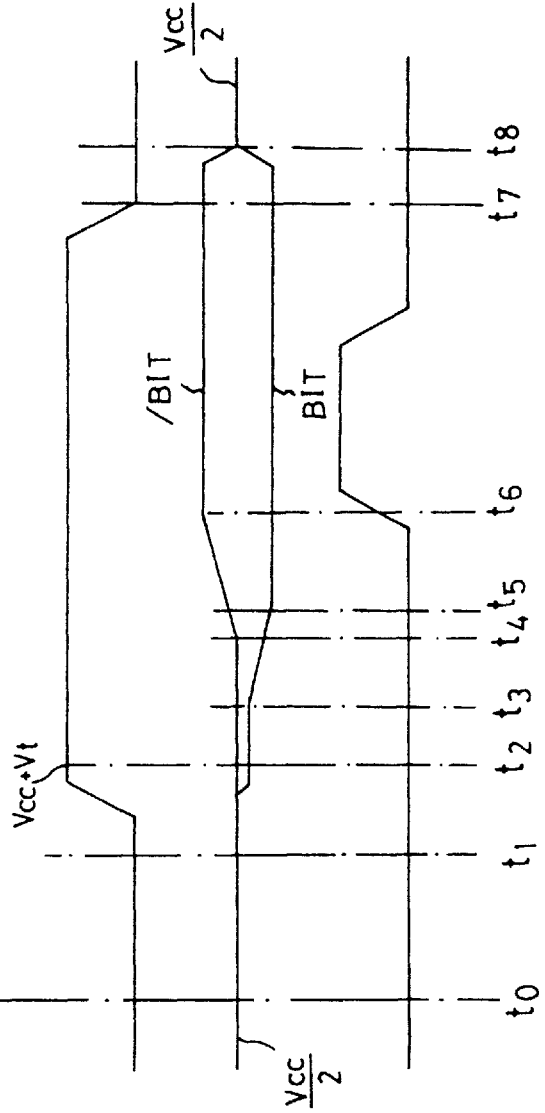
FIG. 3(a) (BACKGROUND ART) /RAS
FIG. 3(b) (BACKGROUND ART) /CAS
FIG. 3(c) (BACKGROUND ART) /WE
FIG. 3(d) (BACKGROUND ART) /WL
FIG. 3(e) (BACKGROUND ART) BIT //BIT
FIG. 3(f) (BACKGROUND ART) CD

SEMICONDUCTOR DEVICE HAVING MULTIPLE SIZED MEMORY ARRAYS

BACKGROUND OF THE INVENTION

1. Field of the Invention

The present invention relates to a semiconductor device, and in particular, a semiconductor memory device with improved data output speed.

2. Background of the Related Art

Various types of semiconductor memory devices are used in a computer system or other program driving system. Common memory devices include DRAM and SRAM. SRAM is very fast but expensive because of a low degree of integration. Therefore, DRAM is generally used in personal computers where the relatively low price and low speed are acceptable.

FIG. 1 is a block diagram showing the structure of a semiconductor memory cell array and peripheral circuits of a related art DRAM. As shown in FIG. 1, a row decoder 11 decodes a row address to select and activate a word line of a memory cell array 12. When a word line of the memory cell array 12 is activated, a column decoder 14 decodes a column address to select a bit line of the memory cell array 12. Sense amplifier 13 sequentially senses and amplifies data in a memory cell connected to the activated word line and then transmits the data to a data output buffer 15.

FIG. 2 is a circuit diagram depicting a memory cell of the memory cell array 12. The general structure of the memory cell includes a transistor and a capacitor. As shown in FIG. 2, a memory cell MC1 has a structure with a capacitor C1 connected between the drain of NMOS transistor Q1 and ground. The source of NMOS transistor Q1 is connected to bit line BIT and the gate to the word line WLn.

As shown in FIG. 2, another memory cell MC2 includes an NMOS transistor Q2 and a capacitor C2. The gate of NMOS transistor Q2 is connected to a word line WLn+1 and the source to a bit line /BIT. As described above, when the word line WLn is activated, the NMOS transistor Q1 is turned on. When the word line WLn+1 is activated, the NMOS transistor Q2 is turned on.

The capacitors C1 and C2 are charged or discharged in accordance with the logic value of data. For example, when the word lines WLn and WLn+1 are respectively activated in a data read mode, the data charged is discharged through the turned on NMOS transistors Q1 and Q2. The discharged data is applied to the bit lines BIT and /BIT so that the bit lines BIT and /BIT vary in voltage. If the capacitors are not charged, there is no change in the voltage of the bit lines BIT and /BIT.

The two bit lines BIT and /BIT are precharged with a voltage of VCC/2. When the NMOS transistors Q1 and Q2 of the memory cells MC1 and MC2 are turned on so that the data of the capacitors C1 and C2 are respectively transmitted to the bit lines BIT and /BIT, the sense amplifier 13 compares the voltage difference between the two bit lines BIT and /BIT, and amplifies the voltage difference.

Referring to FIGS. 1 to 3, the data read operation of the related art semiconductor memory device will now be described. FIG. 3 is a timing chart showing the read operation of a related art semiconductor memory device. The case data of "0" being stored in the memory cell will be described as an example.

FIG. 3(a) shows a row address strobe signal /RAS and FIG. 3(b) shows a column address strobe signal /CAS. FIG. 3(c) shows a write enable signal /WE and FIG. 3(d) shows a word line voltage. FIG. 3(e) shows voltages of a pair of bit lines BIT and /BIT. FIG. 3(f) shows a bit line selection signal CD transmitted from the column decoder 14.

The row address strobe signal /RAS indicates that the row address is input. The column address strobe signal /CAS indicates that the column address is input. The write enable signal /WE controls the read and write operations of the memory device. A high level of the write enable signal /WE causes the write operation and a low level causes the read operation.

Time t0 is a stand-by state of the timing chart of FIG. 3 where the voltage of the word line is low. As described with respect to FIG. 2, the two bit lines BIT and /BIT of the memory cell are pre-charged with the potential VCC/2 or half of the power voltage VCC.

At time t1, the two bit lines BIT and /BIT of FIG. 2 are in a floating state that is not affected by an outside environment. Accordingly, the two bit lines BIT and /BIT sustain the precharge potential VCC/2.

At time t2, the row decoder 11 decodes the row address transmitted from the outside to select word line (e.g., WLn). The row decoder 11 increases the voltage of the selected word line to the sum of the supply voltage VCC and a MOS transistor threshold voltage, Vt. In other words, the voltage level VCC+Vt, is a word line activation level that activates the word line (e.g., WLn).

The NMOS transistor Q1, whose gate is connected to the activated word line WLn, is turned on so that the data stored in the capacitor C1 is applied to the bit line BIT. As shown in FIG. 3, the data of the capacitor C1 is "0". The charges are applied to the bit line BIT in accordance with the data of the capacitor C1 so that the potential of the bit line BIT becomes a potential slightly lower or slightly higher than the precharge voltage VCC/2. The bit line /BIT sustains the precharge voltage VCC/2. Thus, the potential of a bit line to which a cell to be read is connected is changed and the bit line not connected to the cell to be read remains VCC/2. Accordingly, a specified potential difference exists between the two bit lines BIT and /BIT. The sense amplifier 13 is activated to amplify the potential difference between the bit lines BIT and /BIT between time point t3 and time point t4.

When the amplification by the sense amplifier 13 is achieved to some degree (e.g., between t5 and t6), the ground voltage VSS is applied to the bit line BIT and the supply voltage VCC is applied to the bit line /BIT. Thus, the voltage "0" or the potential of the ground voltage VSS is stored by the capacitor C1 through the NMOS transistor Q1, which is turned on by the high level voltage of the word line WLn. As the result, the data can be read and the refresh operation is performed (i.e., data is rewritten).

Such operations are executed when the data stored in the capacitor C1 is "0". If the data of the capacitor C1 is "1", the opposite operations are performed.

If the amplification operation of the sense amplifier 13 is achieved to some degree so the potential difference between the two bit lines BIT and /BIT exceeds the sum of the respective threshold voltages of usual PMOS and NMOS transistors or "|Vtn|+|Vtp|", a signal of the bit line BIT corresponding to the bit line selection signal CD is transmitted to the output buffer 15 via a data bus. At time point t7, the word line WLn is deactivated to sustain the data stored in the capacitor C1 (e.g., by the refresh operation previously described).

At time t8, for succeeding data output operations, the two bit lines BIT and /BIT are equalized by the precharge voltage VCC/2. Thus, the bit lines BIT and /BIT are placed in the stand-by state.

The time necessary for activating a word line is an important factor in many elements determining the data output speed in a related art memory device. An operation start point of the sense amplifier and a selection signal output point of the column decoder depend upon the time point when the word line is activated. Therefore, the amount of time taken for the word line voltage of the ground voltage potential, (e.g., VSS) to reach an activation potential, (e.g., VCC+Vt), determines the output operation time for the overall data. This is an important factor in a write operation. Consequently, a need exists for shortening the data input/output operation time in a semiconductor memory.

SUMMARY OF THE INVENTION

An object of the present invention is provide to a semiconductor memory device that substantially obviates one or more of the problems, limitations and disadvantages of the related art.

An other object of the present invention is to provide a semiconductor memory that improves data output speed by shortening the time necessary to activate a word line.

To achieve these and other advantages in whole or in part and in accordance with the purpose of the present invention, as embodied and broadly described, a semiconductor memory includes a first memory cell array having multiple memory cells; a second memory cell array having more memory cells than the first memory cell array; a first row decoder for decoding a row address received and generating an activation signal for a word line in the first memory cell array; a second row decoder for decoding a row address received and generating an activation signal for a word line in the second memory cell array; a column decoder for decoding a column address received and generating a bit line selection signal for the first and second memory cell arrays; a sense amplifier, which is connected to bit lines selected based upon the bit line selection signals, for detecting a potential difference between the bit lines, generating data having binary logical value of HIGH or LOW by amplifying the potential difference, and rewriting said data on the memory cell from which said data was read.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3(a)–3(f) are diagrams showing the read operation timing chart of a related art semiconductor memory;

DETAILED DESCRIPTION OF PREFERRED EMBODIMENTS

Figure 1:
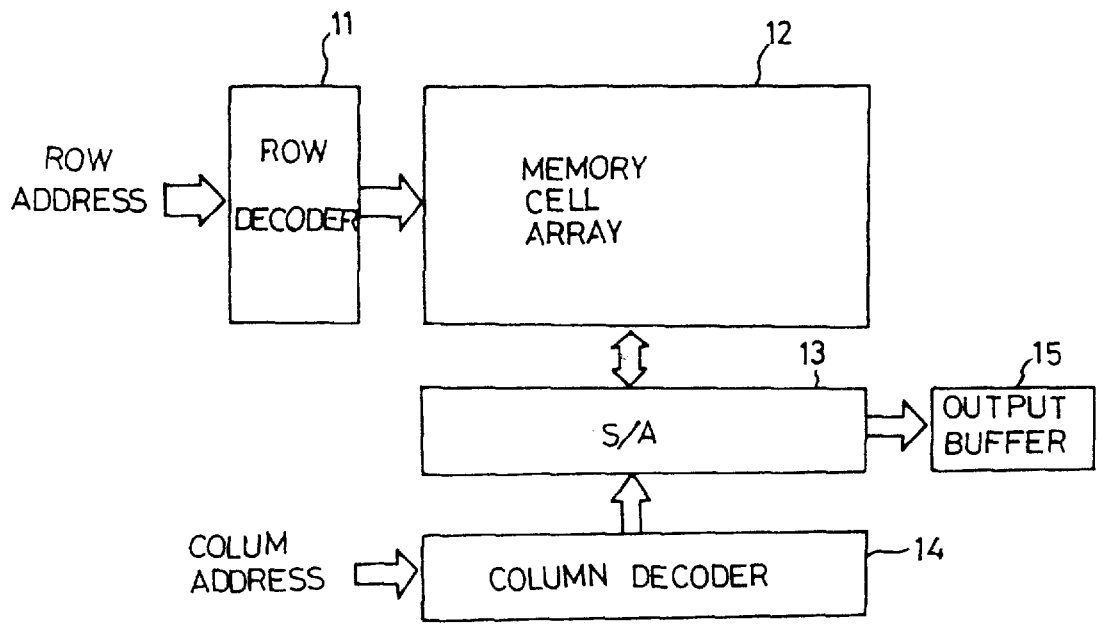
FIG. 1 is a block diagram showing a related art semiconductor memory cell array and peripheral circuits.
Figure 2:
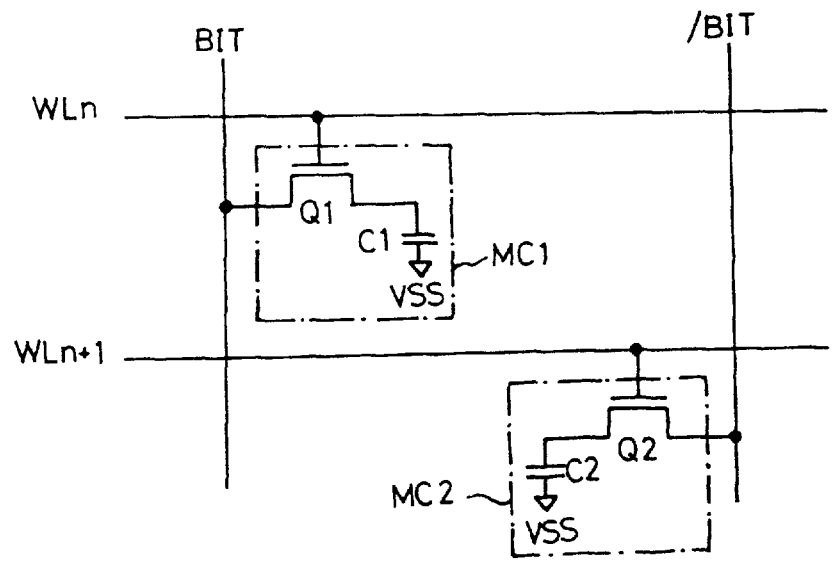
FIG. 2 is a circuit diagram showing a memory cell making up the memory cell array of FIG. 1.
Figure 4:
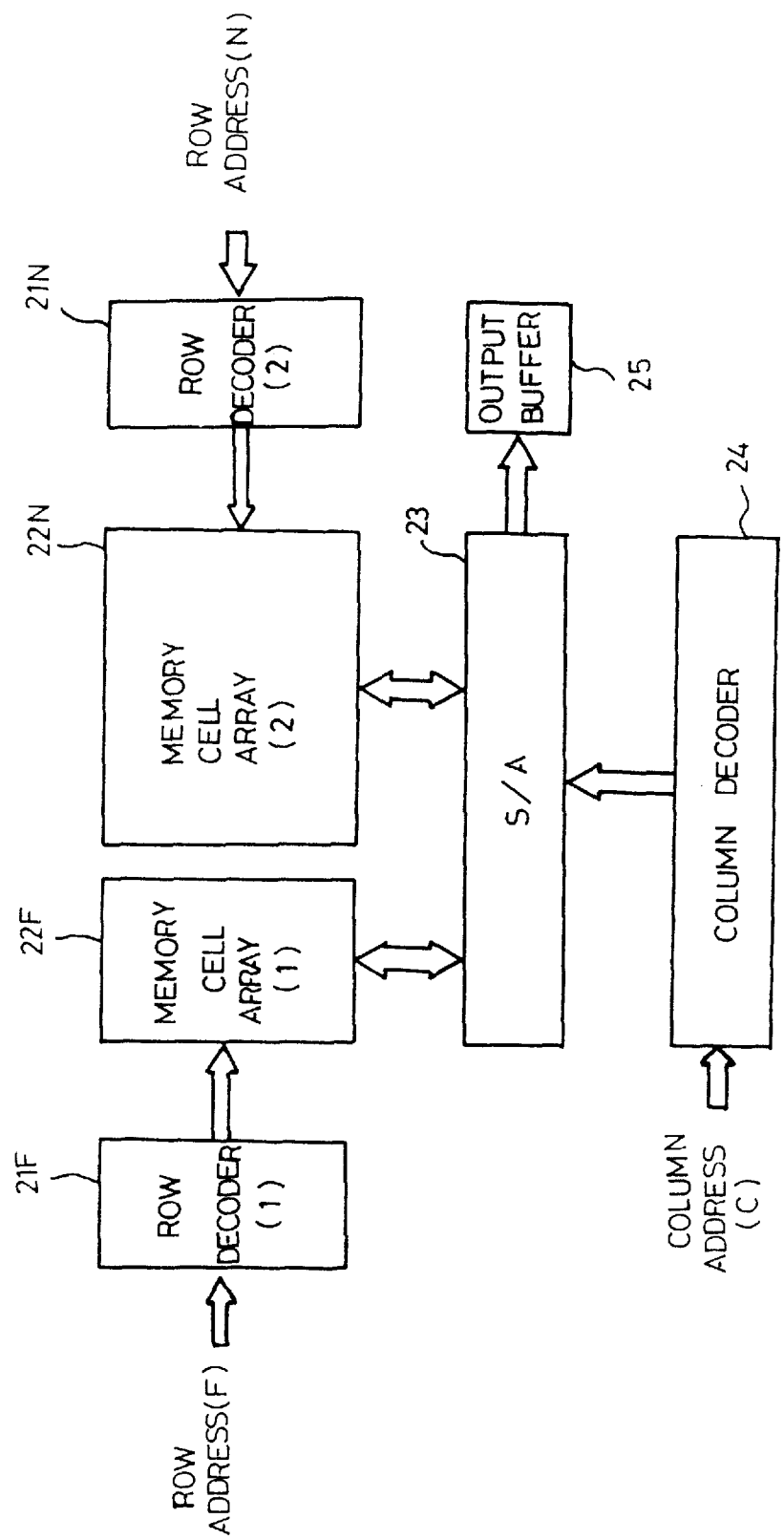
FIG. 4 is a block diagram showing a preferred embodiment of a semiconductor memory cell array and peripheral circuits according to the present invention.
Figure 5:
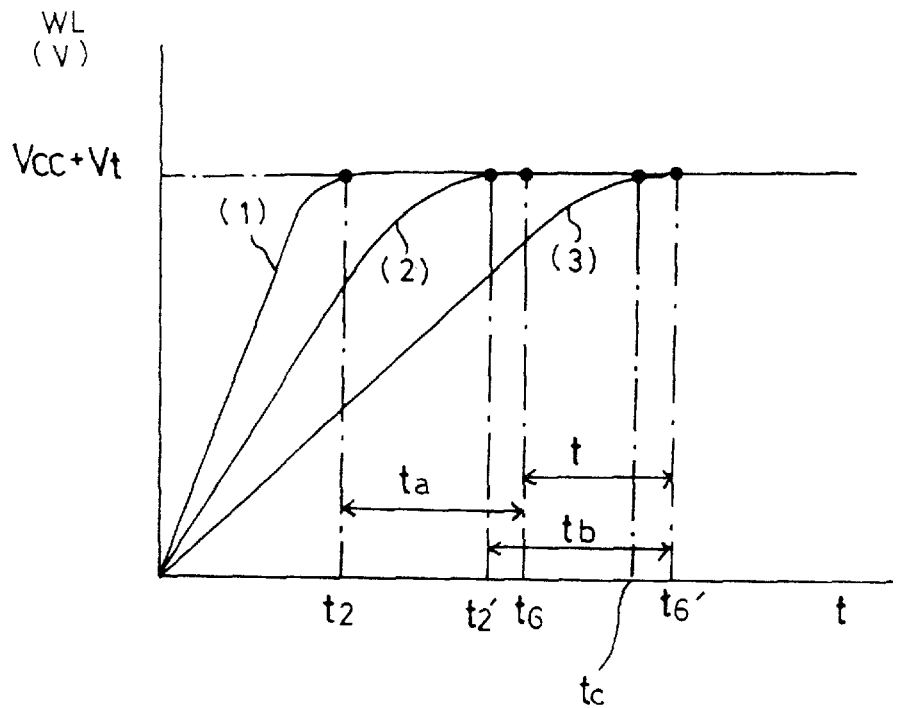
FIG. 5 is a diagram illustrating characteristics of a word line activation voltage in dual memory cell arrays.

With reference to FIGS. 4 to 6, one preferred embodiment according to the present invention will now be described. As shown in FIG. 4, a memory cell array includes a high speed memory cell array 22F having multiple memory cells and a normal memory cell array 22N having relatively many memory cells. Word lines of the two memory cell arrays 22F and 22N are independently activated by respective row decoders 21F and 21N.

When a specified word line in high speed memory cell array 22F is activated, column decoder 24 decodes a column address and selects a bit line corresponding to the decoded column address in the high speed memory cell array 22F. Sense amplifier 23 sequentially senses and amplifies the data in a memory cell that is coupled to the activated word line. The data amplified is output through an output buffer 25.

Since the number of memory cells to be operated by a word line is small in the high speed memory cell array 22F, the wiring length is short. Thus, resistance and parasitic capacitance in the word lines of the high speed memory cell array 22F decrease to reduce the time constant RC of the word line. Additionally, the word line in high speed memory cell array 22F is coupled to relatively few memory cells compared to the normal memory cell array 22N. Thus, a relatively small charge is enough for activation. Further, a time to activate the word line of high speed memory cell array 22F is shorter than time to activate the word line of the normal memory cell array 22N.

While the data in the high speed memory cell array 22F, where a word line has been activated, is being accessed, a word line in the normal memory cell array 22N is activated. Thus, a data access time point is advanced. While the data accessed in the high speed memory cell array 22F is being output, data in a memory cell coupled to the word line activated in the normal memory cell array 22N is accessed. Thus, data in a whole memory cell array including the high speed memory cell array 22F and the normal memory cell array 22N is sequentially accessed.

Data output operations of the preferred embodiment will now be described with reference to FIGS. 5 and 6. The label (1) is a curve illustrating a voltage characteristic of a word line in the high speed memory cell array 22F. The label (2) is a curve illustrating a voltage characteristic of a word line in the normal memory cell array 22N, and the label (3) is a curve illustrating a voltage characteristic of a word line when a memory cell array is not dualized.

As shown in the word line voltage characteristic curve (1) of the high speed memory cell array 22F, the voltage reaches an activation potential VCC+Vt at time point t2. A sense amplification is activated at time point t6 after a prescribed interval of time ta from the time point t2. The prescribed interval time ta between the time points t2 and t6 is determined by a designer with respect to relations between different input/output operations in a memory. Since the time taken for a word line to reach the activation potential, VCC+Vt, may be changed by external factors, the time interval from the time point t2 to the sense amplifier activation time point t6 is necessary to prevent malfunction. Therefore, the prescribed time ta is an essential factor in a data input/output operation.

A word line voltage characteristic curve (2) of FIG. 5 in the normal memory cell array reaches the activation potential VCC+Vt at time point t2'. The sense amplifier is activated for sense amplification at time point t6' after a predetermined time interval tb from time point t2'.

Figure 6A:
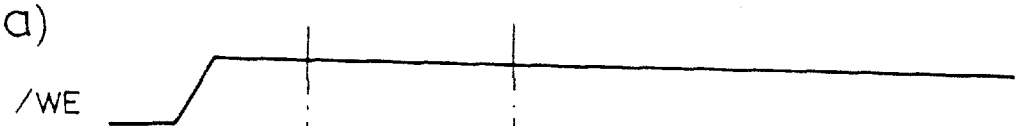
FIGS. 6(a)–6(c) are diagrams showing data output operation timing by dual memory cell arrays.
Figure 6B:
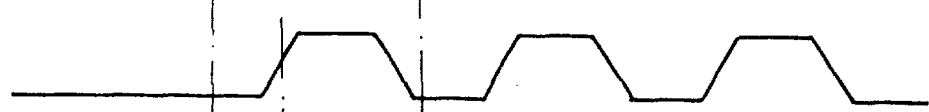
Figure 6C:
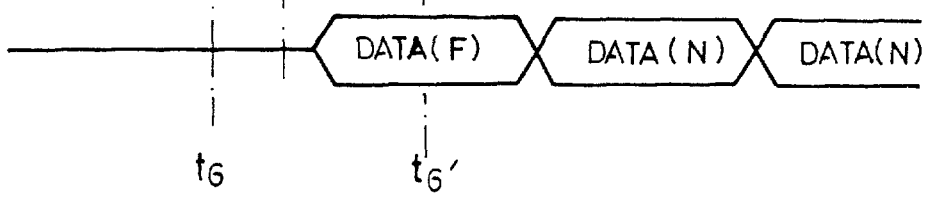

FIG. 6(a) shows a write enable signal. FIG. 6(b) shows a column access signal, which is a data access signal. FIG. 6(c) shows a data output.

When a write operation is activated by a write enable signal /WE of high level, the sense amplifier 23 senses and amplifies data at time point t6 make data access possible. A bit line selection signal such as FIG. 6(b) is then output by the high speed memory cell array 22F, and a data F loaded on the bit line is sent to the output buffer 15. Subsequently, a data N in the normal memory cell array 22N is output.

As described above, the preferred embodiment of the semiconductor memory device according to the present invention has various advantages. The preferred embodiment of the semiconductor device improves data output speed by shortening time necessary for activating a word line in a semiconductor memory.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor memory, comprising:
   a first memory cell array having multiple memory cells;
   a second memory cell array having more memory cells than the first memory cell array;
   a first row decoder that decodes a row address to generate an activation signal for a word line in the first memory cell array;
   a second row decoder that decodes a row address to generate an activation signal for a word line in the second memory cell array;
   a column decoder that decodes a column address to generate a bit line selection signal for the first and second memory cell arrays;
   a sense amplifier that is coupled to bit lines selected based on the bit line selection signals in the first and second memory cell arrays to detect and amplify a potential difference between each of the selected bit lines, wherein a time period to activate the word line in the first memory cell array is less than a time period to activate the word line in the second memory cell array.

2. The semiconductor memory according to claim 1, wherein the word line in the second memory cell array is activated while the data is being output from the first memory cell array, and wherein data is output from the activated word line in the second memory cell array after the data in the first memory cell array is output.

3. The semiconductor memory according to claim 1, wherein a load on the activated word line in the first memory cell array is less than on the activated word line in the second memory cell array.

4. The semiconductor memory according to claim 1, wherein the data is output from the first memory cell array after the word line in the first memory cell array is activated.

5. The semiconductor memory according to claim 1, wherein a single data is output from the first memory cell array after the word line in the first memory cell array is activated, and wherein data is sequentially output from the second memory cell array after the data in the first memory cell array is output.

6. The semiconductor memory device of claim 1, wherein the differing loads on the word line in the first memory cell array and the word line in the second memory cell array reduce a time between sequential data outputs by the semiconductor memory device.

7. The semiconductor memory device of claim 1, further comprising a output data buffer, wherein the sense amplifier generates data having one of a binary logical value of HIGH and LOW based on the detected potential difference and outputs the generated data to the output data buffer.

8. The semiconductor memory device of claim 1, wherein the sense amplifier refreshes the data on the memory cell from which the data was read.

9. A semiconductor device, comprising:
   first and second memory cell arrays, each having a matrix of memory cells and a plurality of substantially perpendicular word lines and bit lines, wherein each of the memory cells is coupled to a corresponding one of the word lines and the bit lines; and
   a sense amplifier that senses and amplifies data from a designated memory cell in the first and second memory cell arrays to output the data from the corresponding memory cell array, wherein a word line activation time in the first memory cell array is less than a word line activation time in the second memory cell array.

10. The semiconductor device according to claim 9, wherein the memory cell in the first memory cell is always accessed first.

11. The semiconductor device according to claim 9, wherein the second memory cell array has more memory cells than the first memory cell array.

12. The semiconductor device according to claim 9, wherein a word line in the second memory cell array is activated while the data is being output from the selected memory cell of first memory cell array, and wherein data is output from the activated word line in the second memory cell array after the data in the first memory cell array is output.

13. The semiconductor device according to claim 9, wherein a load on the word lines in the first memory cell array is less than on the word lines in the second memory cell array.

14. The semiconductor device according to claim 9, wherein the data is output from the first memory cell array after a word line in the first memory cell array is activated.

15. The semiconductor device according to claim 9, wherein a single data is output from the first memory cell array after the word line in the first memory cell array is activated, and wherein data is sequentially output from the second memory cell array after the data in the first memory cell array is output during a device operation.

16. The semiconductor device of claim 9, wherein differing loads on the word lines in the first memory cell array and the word lines in the second memory cell array reduce a time between sequential data outputs by the semiconductor device.

17. The semiconductor device of claim 9, wherein the sense amplifier refreshes the data on the memory cell from which the data was read.

18. The semiconductor device of claim 9, further comprising:
   a first row decoder that decodes a row address to generate an activation signal for a word line in the first memory cell array;
   a second row decoder that decodes a row address to generate an activation signal for a word line in the second memory cell array; and
   a column decoder that decodes a column address to generate a bit line selection signal for the first and second memory cell arrays, wherein the designated memory cell is based on the activated word line in the first and second memory cell arrays and the bit line selection signals.

19. The semiconductor device of claim 9, wherein the semiconductor device is a DRAM.

20. A semiconductor device, comprising:

first and second memory cell arrays, each having a matrix of memory cells and a plurality of substantially perpendicular word lines and bit lines, wherein each of the memory cells is coupled to a corresponding one of the word lines and the bit lines; and a sense amplifier that senses and amplifies data from a designated memory cell in the first and second memory cell arrays to output the data from the corresponding memory cell array, wherein differing loads on the word lines in the first memory cell array and the word lines in the second memory cell array reduce a time between sequential data outputs by the semiconductor device.

* * * * *